United States Patent
Sakai et al.

(10) Patent No.: US 9,164,395 B2
(45) Date of Patent: Oct. 20, 2015

(54) EXPOSURE APPARATUS, AND METHOD OF MANUFACTURING A DEVICE

(75) Inventors: Keita Sakai, Utsunomiya (JP); Tatsuya Hayashi, Utsunomiya (JP); Noriyasu Hasegawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 399 days.

(21) Appl. No.: 13/314,537

(22) Filed: Dec. 8, 2011

(65) Prior Publication Data

US 2012/0170007 A1    Jul. 5, 2012

(30) Foreign Application Priority Data

Jan. 1, 2011 (JP) .................................. 2011-000003

(51) Int. Cl.
*G03F 7/20*    (2006.01)

(52) U.S. Cl.
CPC .......... *G03F 7/70341* (2013.01); *G03F 7/2041* (2013.01)

(58) Field of Classification Search
CPC ...... G03F 7/20; G03F 7/2041; G03F 7/70341
USPC .......................................... 355/30, 77, 72, 73
See application file for complete search history.

(56) References Cited

U.S. PATENT DOCUMENTS

| 6,721,031 | B2 | 4/2004 | Hasegawa et al. | |
|---|---|---|---|---|
| 6,721,032 | B2 | 4/2004 | Hasegawa et al. | |
| 6,934,003 | B2 | 8/2005 | Hasegawa et al. | |
| 6,954,255 | B2 | 10/2005 | Hasegawa et al. | |
| 7,123,343 | B2 | 10/2006 | Hasegawa et al. | |
| 7,561,249 | B2 | 7/2009 | Hayashi | |
| 7,738,076 | B2 | 6/2010 | Hasegawa et al. | |
| 2006/0215137 | A1 | 9/2006 | Hasegawa et al. | |
| 2008/0212046 | A1* | 9/2008 | Riepen et al. | 355/30 |
| 2009/0237631 | A1* | 9/2009 | Poon et al. | 355/30 |
| 2010/0085545 | A1 | 4/2010 | Direcks et al. | |

FOREIGN PATENT DOCUMENTS

| JP | 2008-140957 A | 6/2008 |
|---|---|---|
| JP | 2008-147652 A | 8/2008 |
| JP | 2010-034555 A | 2/2010 |

OTHER PUBLICATIONS

Japanese Office Action dated Nov. 16, 2012, issued in counterpart Japanese Patent Application No. 2011-000003.
English translation of Japanese Office Action dated Nov. 16, 2012, issued in counterpart Japanese Patent Application No. 2011-000003.

* cited by examiner

*Primary Examiner* — Deoram Persaud
(74) *Attorney, Agent, or Firm* — Fitzpatrick, Cella, Harper & Scinto

(57) ABSTRACT

An exposure apparatus that includes a projection optical system, and exposes a substrate to light via the projection optical system and a liquid that is supplied between the projection optical system and the substrate. A plurality of recovery ports recover the liquid supplied between the projection optical system and the substrate, and are discretely arranged between vertices on each side of a polygon and at each of the vertices of the polygon. A chamber, connected to the plurality of recovery ports, receives the liquid. A pump attracts the liquid via the plurality of recovery ports and the chamber. A pressure difference between the pump and each of the recovery ports positioned at the vertices, among the plurality of recovery ports, is less than a pressure difference between the pump and each of the recovery ports positioned between the vertices, among the plurality of recovery ports.

12 Claims, 5 Drawing Sheets

F I G. 3A
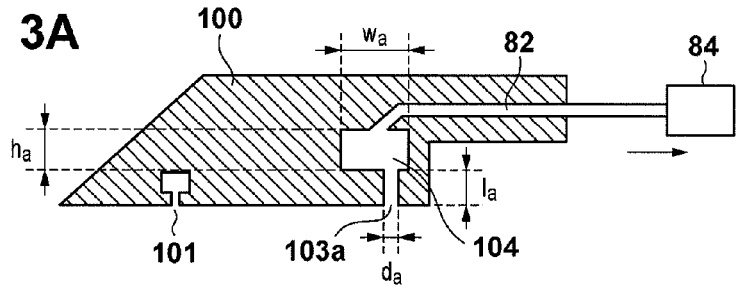
F I G. 3B
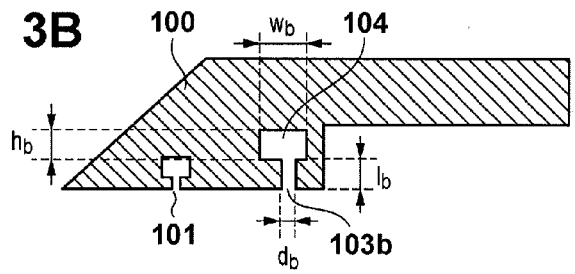
F I G. 4A
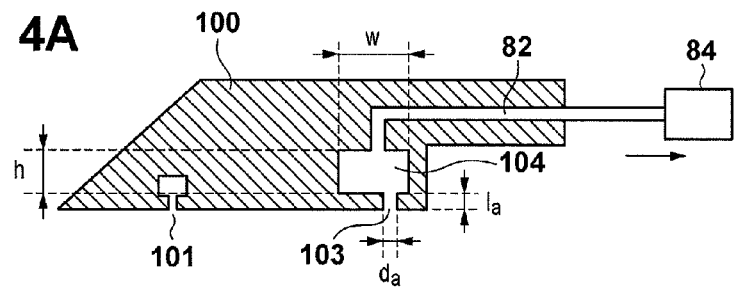
F I G. 4B
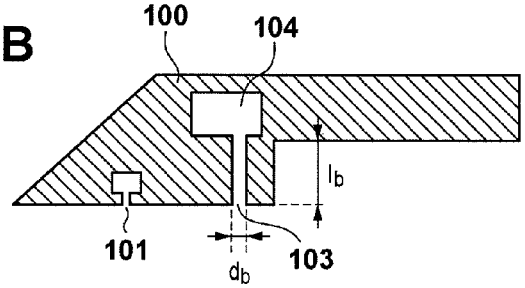

F I G. 5A
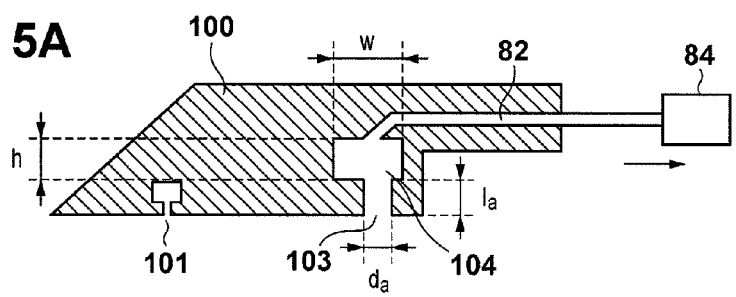
F I G. 5B
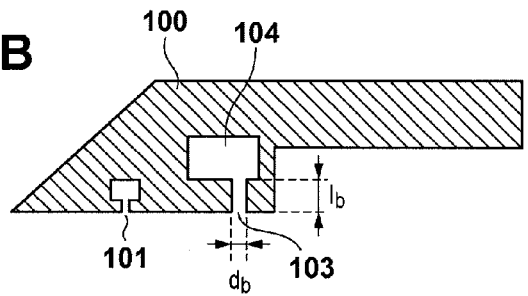

EXPOSURE APPARATUS, AND METHOD OF MANUFACTURING A DEVICE

CLAIM OF PRIORITY

This application claims the benefit of Japanese Patent Application No. 2011-000003 filed on Jan. 1, 2011, which is hereby incorporated by reference herein in its entirety.

BACKGROUND OF THE INVENTION

1. Field of the Invention

The present invention relates to an exposure apparatus, and a method of manufacturing a device.

2. Description of the Related Art

In a process of manufacturing semiconductor devices, and the like, an exposure apparatus (immersion exposure apparatus) exposes a wafer (substrate) while the space between the wafer and a final lens (final lens surface) of a projection optical system has been filed with a liquid. In order to locally hold the liquid, the immersion exposure apparatus has an immersion nozzle for the supply and recovery of the liquid in the periphery of the projection optical system.

The immersion nozzle is designed such that even if the stage holding the wafer is moved at high-velocity, no liquid remains on the wafer. For example, Japanese Patent Laid-Open No. 2008-147652 proposes technology for suppressing the amount of residual liquid on a wafer by disposing multiple recovery openings (ports) on the lower face of an immersion nozzle (the face opposing the wafer), including recovery openings (ports) positioned at the vertices of a polygon and recovery openings (ports) positioned on the sides connecting the vertices. Here, in a case when the angle formed by a line connecting two recovery openings relative to the movement direction of the substrate is a right angle, the meniscus (the edge of the liquid) between these two recovery openings is subjected to the greatest amount of force from the movement of the substrate. In order to address this, the force applied to the meniscus between the two recovery openings can be mitigated by setting the angle so as to be less than a right angle. The technology disclosed in Japanese Patent Laid-Open No. 2008-14762 uses this principle.

With the technology disclosed in Japanese Patent Laid-Open No. 2008-147652, however, it is not possible to mitigate the force acting on the meniscus in the vicinity of the vertices of the polygon, and, therefore there are cases in which the liquid cannot be completely recovered by the recovery openings at the vertices, and the liquid leaks onto the wafer.

SUMMARY OF THE INVENTION

The present invention provides, for example, technology advantageous in terms of recovery of liquid with a recovery port.

According to one aspect, the present invention provides an exposure apparatus including a projection optical system, and configured to expose a substrate to light via the projection optical system and a liquid, the apparatus including a plurality of recovery ports configured to recover the liquid supplied between the projection optical system and the substrate, a chamber connected to the plurality of recovery ports, and a pump configured to attract the liquid via the plurality of recovery ports and the chamber, wherein the plurality of recovery ports are discretely arranged between vertices on each side of a polygon and at each of vertices of the polygon, and a pressure difference between the pump and each of the recovery ports positioned at the vertices among the plurality of recovery ports is less than a pressure difference between the pump and each of the recovery ports positioned between the vertices among the plurality of recovery ports.

Further aspects of the present invention will become apparent from the following description of exemplary embodiments with reference to the attached drawings.

BRIEF DESCRIPTION OF THE DRAWINGS

FIGS. 3A and 3B are schematic diagrams showing another example of a configuration of the immersion nozzle of the exposure apparatus shown in FIG. 1.

FIGS. 4A and 4B are schematic diagrams showing yet another example of a configuration of the immersion nozzle of the exposure apparatus shown in FIG. 1.

FIGS. 5A and 5B are schematic diagrams showing still another example of a configuration of the immersion nozzle of the exposure apparatus shown in FIG. 1.

DESCRIPTION OF THE EMBODIMENTS

Figure 1:
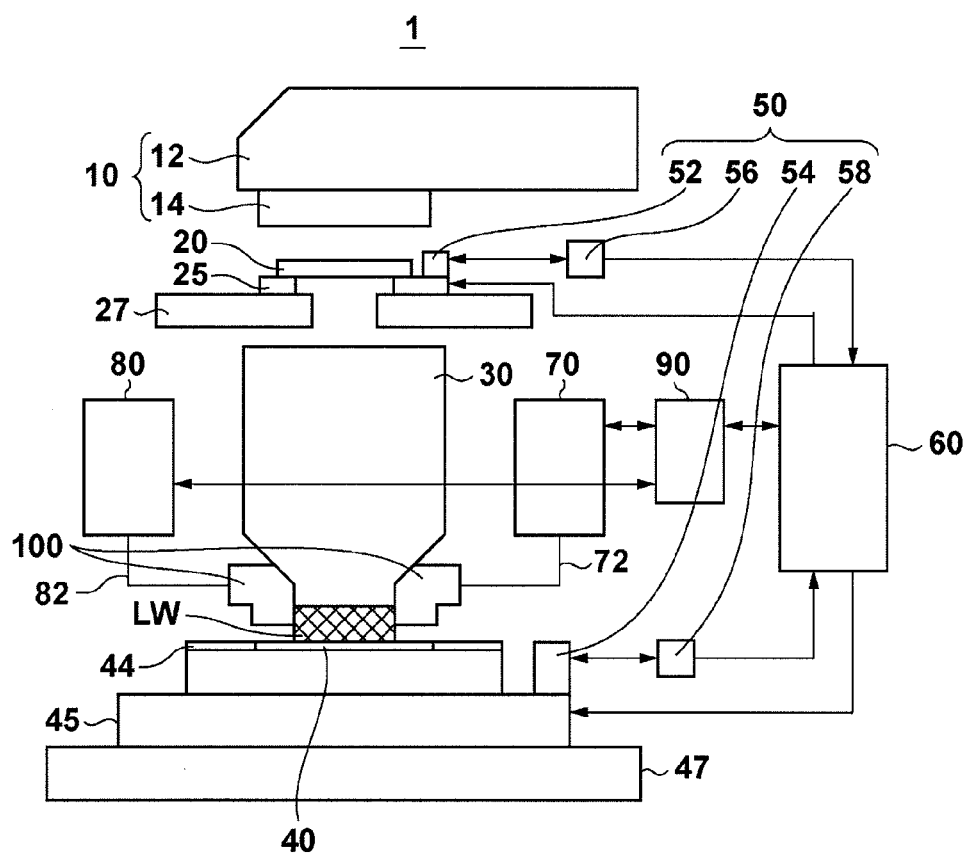
FIG. 1 is a schematic diagram showing a configuration of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic diagram showing a configuration of an exposure apparatus 1 according to an aspect of the present invention. The exposure apparatus 1 is an immersion type of exposure apparatus (immersion exposure apparatus) that exposes a substrate, such as a wafer, via a liquid supplied between the substrate and a projection optical system, using a step-and-scan method (scanning exposure). Note that a step-and-repeat method or another exposure method can also be applied in the exposure apparatus 1.

The exposure apparatus 1 includes an illumination apparatus 10, a reticle stage 25 for the placement of a reticle 20, a projection optical system 30, and a wafer stage 45 for the placement of a wafer 40. The exposure apparatus 1 also includes a ranging apparatus 50, a stage control unit 60, a liquid supply unit 70, a liquid recovery unit 80, an immersion control unit 90, and an immersion nozzle 100.

The illumination apparatus 10 includes a light source unit 12 and an illumination optical system 14, and illuminates the reticle 20, on which a transfer pattern has been formed. In the embodiments of the present invention, an ArF excimer laser having a wavelength of approximately 193 nm is used as the light source of the light source unit 12. Note that the light source unit 12 is not limited to using an ArF excimer laser, and it is possible to use, for example, as the light source, a KrF excimer laser with a wavelength of approximately 248 nm, an $F_2$ laser with a wavelength of approximately 157 nm, or a lamp such as a mercury lamp or a xenon lamp. The illumination optical system 14 is an optical system for illuminating the reticle 20, and includes lenses, mirrors, an optical integrator, an aperture, and the like.

The reticle 20 is conveyed from outside of the exposure apparatus 1 by a reticle conveying system (not shown), and is supported on the movable reticle stage 25. Diffracted light emitted from the reticle 20 (transfer pattern) is projected onto the wafer 40 via the projection optical system 30. The reticle 20 and the wafer 40 are disposed in an optically conjugate relationship. Since the exposure apparatus 1 is a scanning type of exposure apparatus in the embodiments of the present invention, the pattern of the reticle 20 is transferred to the wafer 40 by scanning the reticle 20 and the wafer 40 at a velocity ratio corresponding to a reduction ratio. Note that in a case when the exposure apparatus 1 is an exposure apparatus that uses a step-and-repeat method, exposure is performed while the reticle 20 and the wafer 40 are in a stationary state.

The reticle stage 25 is supported on a surface plate 27. The reticle stage 25 holds the reticle 20 via a reticle chuck (not shown), and is controlled by the stage control unit 60. The reticle stage 25 is driven (scanned) in the scan direction (e.g., the X axis direction) by a linear motor, or the like.

The projection optical system 30 is an optical system that projects the pattern of the reticle 20 onto the wafer 40. A dioptric system, a catadioptric system, or a catoptric system may be used as the projection optical system 30.

The wafer 40 is conveyed from outside of the exposure apparatus 1 by a wafer conveying system (not shown), and is supported on the movable wafer stage 45. The water 40 is a substrate onto which the pattern of the reticle 20 is to be transferred, and may be a liquid crystal substrate or a wide variety of other substrates. A photoresist has been applied to the wafer 40.

A liquid holding unit 44 is a plate member for causing a surface of the wafer 40, supported on the wafer stage 45 and the region outside the wafer 40 (i.e., the wafer stage 45), to be in substantially the same plane, and for holding a liquid LW. The liquid holding unit 44 enables holding the liquid LW (forming a liquid film) in the region outside the wafer 40 when the shot in the vicinity of the outer circumference of the wafer 40 is to be exposed.

The faces of the liquid holding unit 44 that come into contact with the liquid LW have been provided with a polytetrafluoroethylene (PTFE) coating. Also, the faces of the liquid holding unit 44 that come into contact with the liquid LW may be provide with a polyperfluoroalkoxyethylene coating. Also, it is possible to provide a modifying layer made of a copolymer of PTFE and polyperfluoroalkoxyethylene (i.e., PFA), or a fluororesin that is a derivative thereof. Although a PFA material generally has a contact angle of approximately one hundred degrees, the contact angle can be modified (improved) by adjusting the polymerization ratio, introducing a derivative or functional group, or the like. Also, surface treatment using a silane coupling agent such as silane containing perfluoroalkyl groups (heptadecafluorodecylsilane) may be performed on the faces of the liquid holding unit 44 that come into contact with the liquid LW.

The water stage 45 is supported on a surface plate 47. The wafer stage 45 supports the wafer 40 via a wafer chuck (not shown). The water stage 45 has the function of positioning the wafer 40 with six degrees of freedom (x, y, z, ωx, ωy, and ωz) using linear motors, or the like. The wafer stage 45 is controlled by the stage control unit 60 such that the surface of the wafer 40 very highly precisely coincides with the focal plane of the projection optical system 30 during exposure.

The ranging apparatus 50 measures the position of the reticle stage 25 and the two-dimensional position of the wafer stage 45 in real-time using reference mirrors 52 and 54 and laser interferometers 56 and 58. The measurement result obtained by the ranging apparatus 50 is transmitted to the stage control unit 60.

The stage control unit 60 controls the driving of the reticle stage 25 and the wafer stage 45. For example, the stage control unit 60 drives the reticle stage 25 and the wafer stage 45 in order to perform positioning and synchronization control based on the measurement result obtained by the ranging apparatus 50.

The liquid supply unit 70 has the function of supplying the liquid LW to the space (or gap) between the projection optical system 30 and the wafer 40. Note that the space between the projection optical system 30 and the wafer 40 is set to 1 mm, for example, such that the liquid LW can be stably held and removed. Also, the liquid LW absorbs little of the exposure light and has roughly the same refractive index as the optical element of the dioptric system, such as quartz or fluorite. Specifically, purified water, fractional water, a fluoride solution (e.g., fluorocarbon), a hydrocarbon compound, or the like, is used as the liquid LW.

In the embodiments of the present invention, the liquid supply unit 70 includes a refinement apparatus, a deaeration apparatus, a temperature control apparatus, and a supply tube (piping) 72. The refinement apparatus refines the liquid LW by reducing the amount of impurities contained in the source liquid supplied from a source liquid supply source, such as metal ions, microparticles, and organic matter. The liquid LW refined by the refinement apparatus is supplied to the deaeration apparatus. The deaeration apparatus is configured by a membrane module and a vacuum pump, for example, and performs deaeration treatment on the liquid LW so as to reduce the amount of dissolved gas (oxygen and nitrogen) in the liquid LW. For example, removing 80% of the amount of gas that can be dissolved in the liquid LW enables suppressing the amount of air bubble formation, and allowing any air bubbles that form to be immediately absorbed in the liquid. The temperature control apparatus performs control to keep the temperature of the liquid LW subjected to deaeration treatment at a predetermined temperature.

The supply tube 72 is connected to the immersion nozzle 100, or more specifically, a supply opening (port) 101 formed in the immersion nozzle 100. The liquid LW is supplied to the space between the projection optical system 30 and the wafer 40 via the supply tube 72 and the supply opening 101. In order to prevent contamination of the liquid LW, the supply tube 72 is formed from a material having a low amount of eluting substances, such as polytetrafluoroethylene (PTFE) resin, polyethylene resin, or polypropylene resin. Note that, in the case of using a liquid other than purified water as the liquid LW, it is sufficient to form the supply tube 72 from a material that is resistant to the liquid LW and has a low amount of substances that elute into the liquid LW.

The liquid recovery unit 80 has the function of recovering the liquid LW that was supplied to the space between the projection optical system 30 and the wafer 40. In the embodiments of the present invention, the liquid recovery unit 80 includes recovery tubes (pipings) 82, a pump 84, and a tank for temporarily storing the recovered liquid LW. The recovery tubes 82 are connected to the immersion nozzle 100, or more specifically, recovery openings (ports) 103 formed in the immersion nozzle 100 via a chamber 104 formed in the immersion nozzle 100. The pump 84 is a decompression source that decompresses the interior of the chamber 104. The pump 84 is driven so as to form a pressure difference between the recovery openings 103 and the pump 84, and thus, the liquid LW supplied in the space between the projection optical system 30 and the wafer 40 is attracted (recovered) through the recovery openings 103 and the recovery tubes 82. Note that, in order to prevent contamination of the liquid LW, the recovery tubes 82 are formed from a material similar to the material forming the supply tube 72.

The immersion control unit 90 obtains, from the stage control unit 60, information such as the current position, velocity, acceleration, target position, and drive direction of the wafer stage 45, and performs control regarding immersion exposure based on such information. For example, the immersion control unit 90 sends, to the liquid supply unit 70 and the liquid recovery unit 80, control commands indicating the flow rate at which the liquid LW is to be supplied and recovered, for example.

Figure 2A:
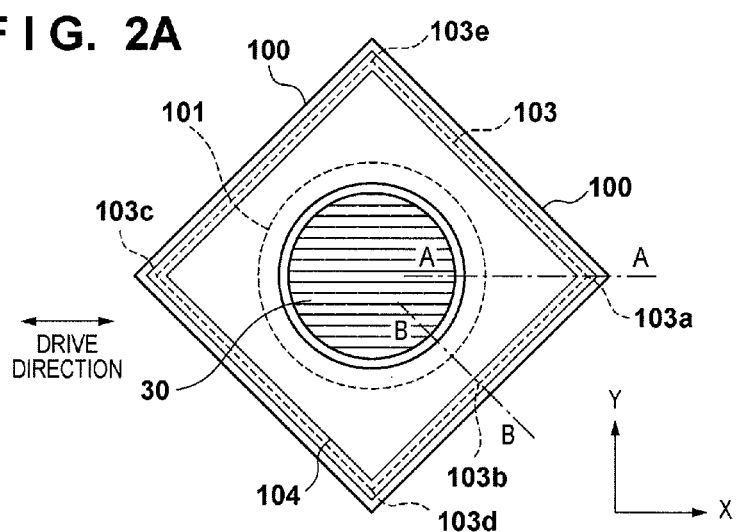
FIGS. 2A to 2C are schematic diagrams showing an example of a configuration of an immersion nozzle of the exposure apparatus shown in FIG. 1.
Figure 2B:
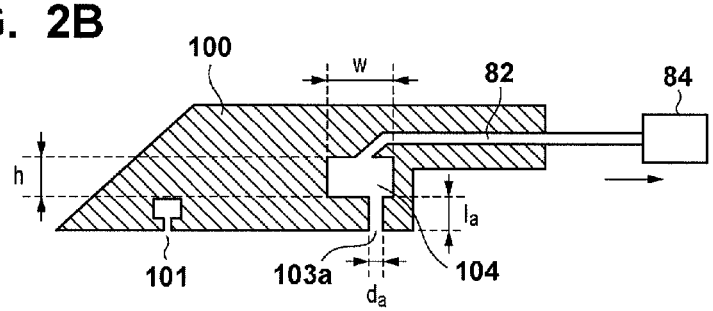
Figure 2C:
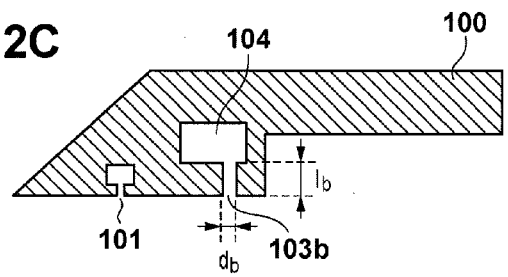

The immersion nozzle 100 is disposed in the periphery of the projection optical system 30 on the substrate side thereof. A plurality of supply openings 101 and recovery openings 103 are formed on the lower face of the immersion nozzle 100, that is to say, the face opposing the wafer 40, as shown in FIGS. 2A to 2C. Note that FIG. 2A is a top view of the immersion nozzle 100, FIG. 2B is a cross-sectional view of the immersion nozzle 100 shown in FIG. 2A taken along line A-A, and FIG. 2C is a cross-sectional view of the immersion nozzle 100 shown in FIG. 2A taken along line B-B.

As described above, each supply opening 101 is connected to the supply tube 72, and is an opening for supplying the liquid LW. Although the supply openings 101 are disposed in a ring shape centered about the projection optical system 30 (optical axis thereof) in the embodiments of the present invention, the supply openings 101 may be disposed in a polygonal shape such as a quadrilateral or an octagon. Also, although each supply opening 101 is constituted by an opening having a pinhole shape or a slit shape in the embodiments of the present invention, a porous member may be fitted into such openings. The porous member is a member obtained by sintering a fibrous or a granular (powdery) metal material or an inorganic material. Examples of the material forming the porous member (the material forming at least the surface thereof) include stainless steel, titanium, $SiO_2$, SiC, and SiC having $SiO_2$ on only the surface as a result of heat treatment.

As described above, the recovery openings 103 are connected to the recovery tubes 82 via the chamber 104, and are openings for recovering the liquid LW. Note that, by recovering gas in the periphery of the liquid LW in addition to recovering the liquid LW, the recovery opening 103 can use the gas to suppress the liquid LW that attempts to leak out. The recovery openings 103 are formed farther outward from the optical axis of the projection optical system 30 than are the supply openings 101, and so as to surround the supply openings 101. Due to forming the recovery openings 103 farther outward than the supply openings 101, the liquid LW does not readily leak out to the periphery. Also, the recovery openings 103 are each constituted by an opening that has a pinhole shape in the embodiments of the present invention.

Included among the recovery openings 103 are recovery openings 103a, 103c, 103d, and 103e that are positioned at the vertices of the polygon defined by the lower face of the immersion nozzle, and recovery openings 103b that are positioned on the sides connecting the vertices of the polygon (between the vertices), and the recovery openings 103 are arranged discretely on the lower face of the immersion nozzle 100. Although the polygon defined by the lower face of the immersion nozzle 100 is a quadrilateral (i.e., the recovery opening 103 are disposed in a quadrilateral shape) as shown in FIG. 2A in the embodiments of the present invention, another polygon such as an octagon is possible.

The chamber 104 is formed in the immersion nozzle 100 and has a shape corresponding to the polygon defined by the lower face of the immersion nozzle 100 (the shape in which the recovery openings 103a, 103c, 103d, and 103e are disposed), that is to say, has a shape whose sides extend along the sides of the polygon. Since the polygon defined by the lower face of the immersion nozzle 100 is a quadrilateral in the embodiments of the present invention, the chamber 104 has a quadrangular ring shape.

By disposing the recovery openings 103 so as to be oblique to the drive direction of the wafer stage 45 in the immersion nozzle 100 as shown in FIG. 2A, the force acting on the gas-liquid interface is mitigated, and the liquid LW does not readily leak out to the periphery. Here, disposing the recovery openings 103 so as to be oblique to the drive direction of the wafer stage 45 means that at least one diagonal among the diagonals of the polygon defined by the lower face of the immersion nozzle 100 conforms to the drive direction of the water stage 45. Also, the drive direction of the wafer stage 45 is any of the main directions in which the wafer stage 45 is driven, such as the scan direction or a direction orthogonal to the scan direction.

Consider a case in which the recovery openings 103 are disposed so as to be oblique to the drive direction of the wafer stage 45, and, for example, the wafer stage 45 is driven in the X-axis positive direction as shown in FIG. 2A. In this case, the recovery opening 103a among the recovery openings positioned at the vertices of the polygon may not be able to completely recover the liquid LW, and the liquid LW may leak out. Similarly, in the case of driving the wafer stage 45 in the X-axis negative direction, the liquid LW may leak out at the recovery opening 103c among the recovery openings positioned at the vertices of the polygon. Also, in the case of driving the water stage 45 in the Y-axis negative direction, the liquid LW may leak out at the recovery opening 103d among the recovery openings positioned at the vertices of the polygon. Similarly, in the case of driving the wafer stage 45 in the Y-axis positive direction, the liquid LW may leak out at the recovery opening 103e among the recovery openings positioned at the vertices of the polygon. In view of this, as will be described in the following embodiments, the immersion nozzle 100 is configured such that the liquid LW recovery performance of the recovery openings positioned at the vertices of the polygon is higher than the liquid LW recovery performance of the recovery openings positioned on the sides connecting the vertices of the polygon. In other words, the immersion nozzle 100 is configured such that the pressure difference between the pump 84 and the recovery openings positioned at the vertices of the polygon is less than the pressure difference between the pump 84 and the recovery openings positioned on the sides connecting the vertices of the polygon. Although the following description focuses on the recovery opening 103a among the recovery openings positioned at the vertices of the polygon, the description of course applies to the recovery openings 103c to 103e as well.

In the case of considering the recovery of only air, the recovery opening 103 needs to be able to recover air at at least 50 L/min. Also, the air recovery rate of the recovery opening 103a is set to 1.5 times to 2.5 times the air recovery rate of the recovery opening 103b (specifically, the lowest recovery rate). In a case when the air recovery rate of the recovery opening 103a is less than 1.5 times the air recovery rate of the recovery opening 103b, the liquid LW recovery performance of the recovery opening 103a is insufficient, and the liquid LW readily leaks out from the positions of the vertices of the polygon. Also, in a case when the air recovery rate of the recovery opening 103a is greater than 2.5 times the air recovery rate of the recovery opening 103b, the liquid LW recovery performance of the recovery opening 103b falls too low, and the liquid LW readily leaks out from positions away from the vertices of the polygon.

The following embodiments describe configurations of the immersion nozzle 100 in detail.

<First Embodiment>

In the first embodiment, as shown in FIG. 2A, the recovery openings 103 are disposed in a quadrangular shape on the lower face of the immersion nozzle 100, and the two diagonals of the quadrilateral conform to the X axis direction and the Y axis direction, which are the main drive directions of the wafer stage 45. Also, diameters da and db of the recovery openings 103a and 103b respectively are 1 mm (see FIGS. 2B and 2C). A distance 1a between the recovery opening 103a and the chamber 104 and a distance 1b between the recovery opening 103b and the chamber 104 are 1.5 mm. The chamber 104 has a shape whose sides extend along the sides of the quadrilateral, and the dimensions of the cross section thereof are a width w of 4 mm and a height h of 3 mm.

In the first embodiment, as shown in FIG. 2B, the recovery tubes 82 are connected to the chamber 104 at positions in the chamber 104 that correspond to the positions of the vertices of the quadrilateral defined by the lower face of the immersion nozzle 100. Also, as shown in FIG. 2C, the recovery tubes 82 are not connected to the chamber 104 at positions in the chamber 104 that correspond to positions on the sides (i.e., positions other than the positions of the vertices) of the quadrilateral defined by the lower face of the immersion nozzle 100. In this way, the chamber 104 is connected to the recovery tubes 82 only at the positions that correspond to the positions of the vertices of the polygon defined by the lower face of the immersion nozzle 100. Accordingly, the pressure loss between the recovery opening 103a and the pump 84 is lower than the pressure loss between the recovery opening 103b and the pump 84, and, therefore, the pressure difference between the recovery opening 103a and the pump 84 is lower than the pressure difference between the recovery opening 103b and the pump 84. For this reason, the liquid LW recovery performance of the recovery opening 103a is greater than the liquid LW recovery performance of the recovery opening 103b, thus enabling suppressing the leakage of the liquid LW from the positions of the vertices of the polygon defined by the lower face of the immersion nozzle 100.

According to the immersion nozzle 100 of the first embodiment, even when the recovery openings 103 are disposed in a polygonal shape, the liquid LW does not leak out from the positions of the vertices of the polygon defined by the lower face of the immersion nozzle 100, and the wafer stage 45 can be driven at high-velocity. This enables obtaining a high-productivity exposure apparatus in which the liquid LW does not leak out even if, for example, the wafer stage 45 is driven at the velocity of 600 mm/sec.

Note that Japanese Patent Laid-Open No. 2008-147652 discloses an immersion nozzle in which the recovery tubes are connected at positions in the chamber that correspond to positions on the sides of the polygon defined by the lower face of the immersion nozzle (i.e., at positions that correspond to the cross section shown in FIG. 2C taken along line B-B). In this case, since there is a longer distance between the recovery tubes and the recovery openings positioned at the vertices of the polygon, and the liquid recovery performance of those recovery openings decreases, the liquid readily leaks out as described above.

Japanese Patent Laid-Open No. 2008-147652 also discloses that auxiliary recovery openings are disposed at positions in the vicinity of the vertices of the polygon in order to improve the liquid recovery performance of the recovery openings positioned at the vertices of the polygon. However, in a case when there is a long distance between the recovery tubes and the recovery openings positioned at the vertices of the polygon, even if auxiliary recovery openings are provided, it is not possible to sufficiently improve the liquid recovery performance of the recovery openings positioned at the vertices of the polygon.

Japanese Patent Laid-Open No. 2008-147652 furthermore discloses that a separate decompression source (pump) is connected to each of the recovery openings. In this case, the leakage of the liquid from the positions on the vertices of the polygon can be suppressed by setting the pressure of the decompression sources that are connected to the recovery openings positioned at the vertices of the polygon so as to be lower than the pressure of the decompression sources that are connected to the recovery openings positioned at positions on the sides of the polygon. However, in actuality, connecting multiple recovery openings and multiple decompression sources with respective recovery tubes is difficult in consideration of implementation in the exposure apparatus and cost. Also, since the flow rate ratio between liquid and gas differs for each recovery tube, lowering the temperature of the immersion nozzle that rises due to vaporization heat becomes complicated, thus making it difficult to control the temperature of the immersion nozzle and the projection optical system in the periphery of the immersion nozzle. On the other hand, the immersion nozzle of the present embodiment has a comparatively simple structure as described above, and enables reducing (suppressing) the leakage of liquid on the wafer while avoiding problems regarding implementation, cost, and vaporization heat.

<Second Embodiment>

FIGS. 3A and 3B are schematic diagrams showing the configuration of the immersion nozzle 100 according to a second embodiment, in which FIG. 3A is a cross-sectional view of the immersion nozzle 100 shown in FIG. 2A, taken along line A-A and FIG. 3B is a cross-sectional view of the immersion nozzle 100 shown in FIG. 2A, taken along line B-B.

In the second embodiment, similar to the first embodiment, the recovery openings 103 are disposed in a quadrangular shape on the lower face of the immersion nozzle 100, and the two diagonals of the quadrilateral conform to the X axis direction and the Y axis direction, which are the main drive directions of the wafer stage 45. Also, diameters da and db of the recovery openings 103a and 103b respectively are 1 mm (see FIGS. 3A and 3B). A distance 1a between the recovery opening 103a and the chamber 104 and a distance 1b between the recovery opening 103b and the chamber 104 are 1.5 mm.

The chamber 104 has a shape whose sides extend along the sides of the quadrilateral, and the dimensions of the cross section thereof decrease with increasing distance from the vertices along the sides of the polygon defined by the lower face of the immersion nozzle 100. Specifically, at positions corresponding to the portions of the vertices of the polygon defined by the lower face of the immersion nozzle 100, the dimensions of the cross section of the chamber 104 are a width wa of 4 mm and a height ha of 3 mm (see FIG. 3A). Also, at positions corresponding to positions on the sides of the polygon defined by the lower face of the immersion nozzle 100, the dimensions of the cross section of the chamber 104 are a width wb of 2 mm and a height hb of 1.5 mm (see FIG. 3B). Accordingly, the pressure loss between the recovery opening 103a and the pump 84 is lower than the pressure loss between the recovery opening 103b and the pump 84, and, therefore, the pressure difference between the recovery opening 103a and the pump 84 is lower than the pressure difference between the recovery opening 103b and the pump 84. For this reason, the liquid LW recovery performance of the recovery opening 103a is greater than the liquid LW recovery performance of the recovery opening 103b, thus enabling suppressing the leakage of the liquid LW from the positions of the vertices of the polygon defined by the lower face of the immersion nozzle 100.

In the second embodiment, as shown in FIG. 3A, the recovery tubes 82 are connected to the chamber 104 at positions in the chamber 104 that correspond to the positions of the vertices of the quadrilateral defined by the lower face of the immersion nozzle 100. Also, as shown in FIG. 3B, the recovery tubes 82 are not connected to the chamber 104 at positions in the chamber 104 that correspond to positions on the sides (i.e., positions other than the positions of the vertices) of the quadrilateral defined by the lower face of the immersion nozzle 100. Note that, in a case in which the pressure difference between the recovery opening 103a and the pump 84 can be set to be sufficiently greater than the pressure difference between the recovery opening 103b and the pump 84, by varying the dimensions of the cross section of the chamber 104, there is no limitation on the positions where the recovery tubes 82 are connected.

According to the immersion nozzle 100 of the second embodiment, even when the recovery openings 103 are disposed in a polygonal shape, the liquid LW does not leak out from the positions of the vertices of the polygon defined by the lower face of the immersion nozzle 100, and the wafer stage 45 can be driven at a high-velocity. This enables obtaining a high-productivity exposure apparatus in which the liquid LW does not leak out even if, for example, the wafer stage 45 is driven at the velocity of 600 mm/sec.

<Third Embodiment>

FIGS. 4A and 4B are schematic diagrams showing the configuration of the immersion nozzle 100 according to a third embodiment, where FIG. 4A is a cross-sectional view of the immersion nozzle 100 shown in FIG. 2A, taken along line A-A, and FIG. 4B is a cross-sectional view of the immersion nozzle 100 shown in FIG. 2A, taken along line B-B.

In the third embodiment, similar to the first embodiment, the recovery openings 103 are disposed in a quadrangular shape on the lower face of the immersion nozzle 100, and the two diagonals of the quadrilateral conform to the X axis direction and the Y axis direction, which are the main drive directions of the wafer stage 45. The chamber 104 has a shape whose sides extend along the sides of the quadrilateral, and the dimensions of the cross section thereof are a width w of 4 mm and a height h of 3 mm.

Also, diameters da and db of the recovery openings 103a and 103b, respectively, are 1 mm (see FIGS. 4A and 4B). A distance 1a between the recovery opening 103a and the chamber 104 is shorter than a distance 1b between the recovery opening 103b and the chamber 104. In other words, the length of the flow channel (path) that connects the recovery opening 103a and the chamber 104 is shorter than the length of the flow channel that connects the recovery opening 103b and the chamber 104. Specifically, the distance 1a between the recovery opening 130a and the chamber 104 is 1 mm, and the distance 1b between the recovery opening 103b and the chamber 104 is 4 mm.

In this way, in the present embodiment, the length of the flow channel connecting the recovery openings 103 to the chamber 104 increases with increasing distance from the vertices along the sides of the polygon defined by the lower face of the immersion nozzle 100. As shown in FIG. 4A, in a case when the distance between the recovery opening 103a and the chamber 104 is short, the pressure loss between the recovery opening 103a and the chamber 104 decreases. On the other hand, as shown in FIG. 4B, in a case when the distance between the recovery opening 103b and the chamber 104 is long, the pressure loss between the recovery opening 103b and the chamber 104 increases. Accordingly, the pressure loss between the recovery opening 103a and the pump 84 is lower than the pressure loss between the recovery opening 103b and the pump 84, and, therefore, the pressure difference between the recovery opening 103a and the pump 84 is lower than the pressure difference between the recovery opening 103b and the pump 84. For this reason, the liquid LW recovery performance of the recovery opening 103a is greater than the liquid LW recovery performance of the recovery opening 103b, thus enabling suppressing the leakage of the liquid LW from the positions of the vertices of the polygon defined by the lower face of the immersion nozzle 100.

In the third embodiment, as shown in FIG. 4A, the recovery tubes 82 are connected to the chamber 104 at positions in the chamber 104 that correspond to the positions of the vertices of the quadrilateral defined by the lower face of the immersion nozzle 100. Also, as shown in FIG. 4B, the recovery tubes 82 are not connected to the chamber 104 at positions in the chamber 104 that correspond to positions on the sides (i.e., positions other than the positions of the vertices) of the quadrilateral defined by the lower face of the immersion nozzle 100. Note that, in a case when the pressure difference between the recovery opening 103a and the pump 84 can be set to be sufficiently greater than the pressure difference between the recovery opening 103b and the pump 84, by varying the distance between the chamber 104 and the recovery openings 103, there is not limitation on the positions where the recovery tubes 82 are connected.

According to the immersion nozzle 100 of the third embodiment, even when the recovery openings 103 are disposed in a polygonal shape, the liquid LW does not leak out from the positions of the vertices of the polygon defined by the lower face of the immersion nozzle 100, and the wafer stage 45 can be driven at high-velocity. This enables obtaining a high-productivity exposure apparatus in which the liquid LW does not leak out even if, for example, the wafer stage 45 is driven at the velocity of 600 mm/sec.

<Fourth Embodiment>

FIGS. 5A and 5B are schematic diagrams showing the configuration of the immersion nozzle 100 according to a fourth embodiment, where FIG. 5A is a cross-sectional view of the immersion nozzle 100 shown in FIG. 2A, taken along line A-A, and FIG. 5B is a cross-sectional view of the immersion nozzle 100 shown in FIG. 2A, taken along line B-B.

In the fourth embodiment, similar to the first embodiment, the recovery openings 103 are disposed in a quadrangular shape on the lower face of the immersion nozzle 100, and the two diagonals of the quadrilateral conform to the X axis direction and the Y axis direction, which are the main drive directions of the wafer stage 45. The chamber 104 has a shape whose sides extend along the sides of the quadrilateral, and the dimensions of the cross section thereof are a width w of 4 mm and a height h of 3 mm.

A distance 1a between the recovery opening 103a and the chamber 104 and a distance 1b between the recovery opening 103b and the chamber 104 are 1.5 mm. A diameter da of the recovery opening 103a is greater than a diameter db of the recovery opening 103b. Specifically, the diameter da of the recovery opening 103a is 2 mm, and the diameter db of the recovery opening 103b is 1 mm (see FIGS. 5A and 5B). In other words, the dimension of the cross section of the flow channel that connects the recovery opening 103a and the chamber 104 is greater than the dimension of the cross section of the flow channel that connects the recovery opening 103b and the chamber 104.

In this way, in the present embodiment, the dimension of the cross section of the flow channels connecting the recovery openings 103 to the chamber 104 decreases with increasing distance from the vertices along the sides of the polygon defined by the lower face of the immersion nozzle 100. As shown in FIG. 5A, in a case when the dimension of the cross section of the flow channel connecting the recovery opening 103a and the chamber 104 is large, the pressure loss between the recovery opening 103a and the chamber 104 decreases. On the other hand, as shown in FIG. 5B, in a case when the dimension of the cross section of the flow channel connecting the recovery opening 103b and the chamber 104 is small, the pressure loss between the recovery opening 103b and the chamber 104 increases. Accordingly, the pressure loss between the recovery opening 103a and the pump 84 is lower than the pressure loss between the recovery opening 103b and the pump 84, and, therefore, the pressure difference between the recovery opening 103a and the pump 84 is lower than the pressure difference between the recovery opening 103b and the pump 84. For this reason, the liquid LW recovery performance of the recovery opening 103a is greater than the liquid LW recovery performance of the recovery opening 103b, thus enabling suppressing the leakage of the liquid LW from the positions of the vertices of the polygon defined by the lower face of the immersion nozzle 100.

In the fourth embodiment, as shown in FIG. 5A, the recovery tubes 82 are connected to the chamber 104 at positions in the chamber 104 that correspond to the positions of the vertices of the quadrilateral defined by the lower face of the immersion nozzle 100. Also, as shown in FIG. 5B, the recovery tubes 82 are not connected to the chamber 104 at positions in the chamber 104 that correspond to positions on the sides (i.e., positions other than the positions of the vertices) of the quadrilateral defined by the lower face of the immersion nozzle 100. Note that, in a case when the pressure difference between the recovery opening 103a and the pump 84 can be set to be sufficiently greater than the pressure difference between the recovery opening 103b and the pump 84 by varying the dimension of the cross section of the flow channels connecting the chamber 104 and the recovery openings 103, there is no limitation on the positions where the recovery tubes 82 are connected.

According to the immersion nozzle 100 of the fourth embodiment, even when the recovery openings 103 are disposed in a polygonal shape, the liquid LW does not leak out from the positions of the vertices of the polygon defined by the lower face of the immersion nozzle 100, and the wafer stage 45 can be driven at a high-velocity. This enables obtaining a high-productivity exposure apparatus in which the liquid LW does not leak out even if, for example, the wafer stage 45 is driven at the velocity of 600 mm/sec.

<Fifth Embodiment>

Figure 6A:
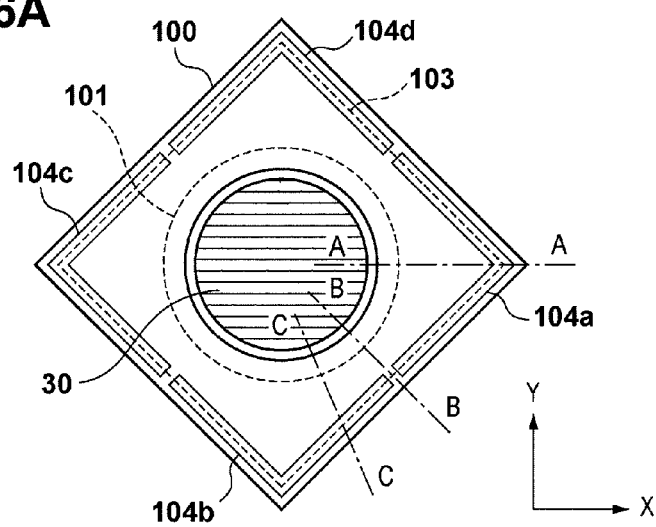
FIGS. 6A to 6D are schematic diagrams showing still another example of a configuration of the immersion nozzle of the exposure apparatus shown in FIG. 1.
Figure 6B:
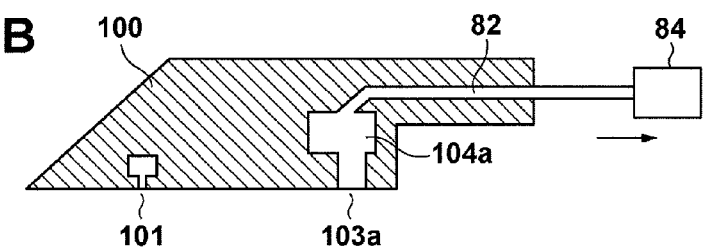
Figure 6C:
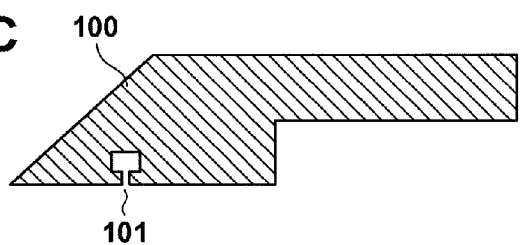
Figure 6D:
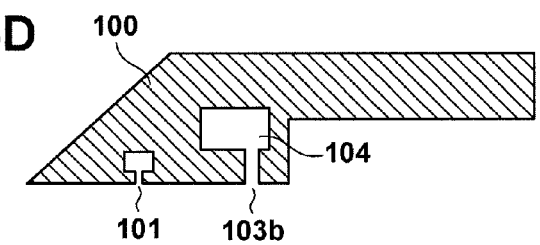

FIGS. 6A to 6D are schematic diagrams showing the configuration of the immersion nozzle 100 according to the fifth embodiment. FIG. 6A is a top view of the immersion nozzle 100, FIG. 6B is a cross-sectional view of the immersion nozzle 100 shown in FIG. 6A, taken along line A-A, FIG. 6C is a cross-sectional view of the immersion nozzle 100 shown in FIG. 6A, taken along line B-B, and FIG. 6D is a cross-sectional view of the immersion nozzle 100 shown in FIG. 6A, taken along line C-C.

In the fifth embodiment, the diameters and arrangement of the recovery openings 103 and the dimensions of the cross section of the chamber 104 are the same as those in the fourth embodiment. Although the chamber 104 is formed in a continuous manner in the immersion nozzle 100 according to the fourth embodiment, the chamber 104 is partitioned at positions corresponding to the cross section shown in FIG. 6C, taken along line B-B, in the immersion nozzle 100 according to the fifth embodiment. In other words, the chamber 104 includes multiple chambers (chamber parts) that are each connected to the pump 84, and the chambers are disposed corresponding to the positions of the vertices of the polygon defined by the lower face of the immersion nozzle 100. In the present embodiment, as shown in FIG. 6A, the chamber 104 includes a first chamber 104a, a second chamber 104b, a third chamber 104c, and a fourth chamber 104d.

In a case when the immersion nozzle 100 crosses a gap or a level change, the pressure in the chamber 104 temporarily increases, and there is a possibility of a decrease in the liquid LW recovery performance. In such a case, partitioning the chamber 104 as with the present embodiment enables limiting the decrease in the liquid LW recovery performance in an individual part into which the chamber 104 was partitioned.

Note that, in the fifth embodiment, as shown in FIG. 6B, the recovery tubes 82 are connected to the chamber 104 at positions in the chambers 104a to 104d that correspond to the positions of the vertices of the quadrilateral defined by the lower face of the immersion nozzle 100. Also, as shown in FIGS. 6C and 6D, the recovery tubes 82 are not connected to the chamber 104 at positions in the chambers 104a to 104d that correspond to positions on the sides (i.e., positions other than the positions of the vertices) of the quadrilateral defined by the lower face of the immersion nozzle 100. Accordingly, the pressure loss between the recovery opening 103a and the pump 84 is lower than the pressure loss between the recovery opening 103b and the pump 84, and, therefore, the pressure difference between the recovery opening 103a and the pump 84 is lower than the pressure difference between the recovery opening 103b and the pump 84. For this reason, the liquid LW recovery performance of the recovery opening 103a is greater than the liquid LW recovery performance of the recovery opening 103b, thus enabling suppressing the leakage of the liquid LW from the positions of the vertices of the polygon defined by the lower face of the immersion nozzle 100.

According to the immersion nozzle 100 of the fifth embodiment, even when the recovery openings 103 are disposed in a polygonal shape, the liquid LW does not leak out from the positions of the vertices of the polygon defined by the lower face of the immersion nozzle 100, and the wafer stage 45 can be driven at a high-velocity. This enables obtaining a high-productivity exposure apparatus in which the liquid LW does not leak out even if, for example, the wafer stage 45 is driven at the velocity of 600 mm/sec.

In exposure, the illumination optical system 14 illuminates the reticle 20 with light emitted from the light source unit 12. Light that reflects the pattern of the reticle 20 is then formed into an image on the wafer 40 by the projection optical system 30. At this time, the liquid LW is supplied between the projection optical system 30 and the wafer 40 via the immersion nozzle 100, and the liquid LW that has been supplied between the projection optical system 30 and the wafer 40 is recovered via the immersion nozzle 100. According to the immersion nozzle 100, as described above, even if the wafer stage 45 is driven at high-velocity, it is possible to suppress the leakage of the liquid LW from the positions of the vertices of the polygon defined by the lower face of the immersion nozzle 100.

The exposure apparatus 1 can provide devices (e.g., a semiconductor device, an LCD device, an image sensing device (e.g., a CCD), and a thin-film magnetic head) with high throughput and good economical efficiency. These devices are fabricated by a step of exposing a substrate (e.g., a wafer or a glass plate) coated with a resist (photosensitive agent)

using the exposure apparatus 1, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus including a projection optical system, and configured to expose a substrate to light via the projection optical system and a liquid that is supplied between the projection optical system and the substrate, the apparatus comprising:
   a plurality of recovery ports configured to recover the liquid supplied between the projection optical system and the substrate, wherein the plurality of recovery ports is discretely arranged between vertices on each side of a polygon and at each of the vertices of the polygon;
   a chamber connected to the plurality of recovery ports and configured to receive the recovered liquid;
   a pump configured to attract the supplied liquid via the plurality of recovery ports and the chamber; and
   a plurality of recovery pipings that connect the chamber and the pump,
   wherein (i) a pressure difference between the pump and each of the recovery ports positioned at the vertices, among the plurality of recovery ports, is less than a pressure difference between the pump and each of the recovery ports positioned between the vertices, among the plurality of recovery ports, (ii) the chamber is shaped to extend along the sides of the polygon, and (iii) the plurality of recovery pipings is connected to the chamber at respective positions in the chamber that respectively correspond to positions of the vertices of the polygon.

2. The apparatus according to claim 1, wherein the chamber is shaped such that a dimension of a cross section of the chamber decreases with an increase in a distance from each of the vertices along each of the sides of the polygon.

3. The apparatus according to claim 1, further comprising a plurality of flow paths that respectively connect the chamber and the plurality of recovery ports,
   wherein a length of each of the flow paths that respectively connect the chamber and the recovery ports positioned at the vertices is shorter than a length of each of the flow paths that respectively connect the chamber and the recovery ports positioned between the vertices.

4. The apparatus according to claim 1, further comprising a plurality of flow paths that respectively connect the chamber and the plurality of recovery ports,
   wherein a dimension of a cross section of each of the flow paths that respectively connect the chamber and the recovery ports positioned at the vertices is greater than a dimension of a cross section of each of the flow paths that respectively connect the chamber and the recovery ports positioned between the vertices.

5. The apparatus according to claim 1,
   wherein the chamber includes a plurality of chamber parts, each of which is connected to the pump, and
   the plurality of chamber parts is disposed at positions respectively corresponding to the positions of the vertices of the polygon.

6. The apparatus according to claim 1, wherein the apparatus is configured as (a) a scanning exposure apparatus, and (b) such that one of (i) a scan direction and (ii) a direction orthogonal to the scan direction thereof is parallel with one of diagonals of the polygon.

7. A method of manufacturing a device, the method comprising:
   (A) exposing a substrate to light using an exposure apparatus;
   (B) developing the exposed substrate; and
   (C) processing the developed substrate to manufacture the device,
   wherein the exposure apparatus includes a projection optical system, and is configured to expose a substrate to light via the projection optical system and a liquid that is supplied between the projection optical system and the substrate, the apparatus comprising:
      (a) a plurality of recovery ports configured to recover the liquid supplied between the projection optical system and the substrate, wherein the plurality of recovery ports is discretely arranged between vertices on each side of a polygon and at each of the vertices of the polygon;
      (b) a chamber connected to the plurality of recovery ports and configured to receive the recovered liquid;
      (c) a pump configured to attract the supplied liquid via the plurality of recovery ports and the chamber; and
      (d) a plurality of recovery pipings that connect the chamber and the pump,
      wherein (i) a pressure difference between the pump and each of the recovery ports positioned at the vertices, among the plurality of recovery ports, is less than a pressure difference between the pump and each of the recovery ports positioned between the vertices, among the plurality of recovery ports, (ii) the chamber is shaped to extend along the sides of the polygon, and (iii) the plurality of recovery pipings is connected to the chamber at respective positions in the chamber that respectively correspond to positions of the vertices of the polygon.

8. The method according to claim 7, wherein the chamber is shaped such that a dimension of a cross section of the chamber decreases with an increase in a distance from each of the vertices along each of the sides of the polygon.

9. The method according to claim 7, wherein the chamber includes a plurality of chamber parts, each of which is connected to the pump, and
   the plurality of chamber parts is disposed at positions respectively corresponding to the positions of the vertices of the polygon.

10. The method according to claim 7, further comprising a plurality of flow paths that respectively connect the chamber and the plurality of recovery ports,
    wherein the length of each of the flow paths that respectively connect the chamber and the recovery ports positioned at the vertices is shorter than a length of each of the flow paths that respectively connect the chamber and the recovery ports positioned between the vertices.

11. The method according to claim 7, further comprising a plurality of flow paths that respectively connect the chamber and the plurality of recovery ports,
    wherein a dimension of a cross section of each of the flow paths that respectively connect the chamber and the recovery ports positioned at the vertices is greater than a dimension of a cross section of each of the flow paths that respectively connect the chamber and the recovery ports positioned between the vertices.

12. The method according to claim 7, wherein the apparatus is configured as (a) a scanning exposure apparatus, and (b)

such that one of (i) a scan direction and (ii) a direction orthogonal to the scan direction thereof is parallel with one of diagonals of the polygon.

* * * * *